United States Patent
Chen et al.

(10) Patent No.: US 10,064,485 B2
(45) Date of Patent: Sep. 4, 2018

(54) SLIDE RAIL ASSEMBLY

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/344,568

(22) Filed: Nov. 6, 2016

(65) Prior Publication Data
US 2017/0340110 A1    Nov. 30, 2017

(30) Foreign Application Priority Data
May 31, 2016   (TW) ............................. 105117122 A (51) Int. Cl.
F16M 13/00    (2006.01)
A47B 88/403   (2017.01)
A47B 88/43    (2017.01)
A47B 88/41    (2017.01)
A47B 88/44    (2017.01)
A47B 96/07    (2006.01)
(Continued)

(52) U.S. Cl.
CPC ............ *A47B 88/403* (2017.01); *A47B 88/41* (2017.01); *A47B 88/43* (2017.01); *A47B 88/44* (2017.01); *A47B 88/493* (2017.01); *A47B 96/07* (2013.01); *H05K 7/1489* (2013.01); *H05K 7/183* (2013.01); *A47B 2088/4235* (2017.01); *A47B 2088/4274* (2017.01); *A47B 2088/4278* (2017.01)

(58) Field of Classification Search
CPC ........ H05K 7/1489; A47B 88/44; A47B 88/45
See application file for complete search history.

(56) References Cited

U.S. PATENT DOCUMENTS 6,181,549 B1   1/2001  Mills
6,230,903 B1   5/2001  Abbott
(Continued)

FOREIGN PATENT DOCUMENTS

EP    2 777 431 A1    9/2014
JP    2004187906 A    7/2004
(Continued)

*Primary Examiner* — Amy J. Sterling
(74) *Attorney, Agent, or Firm* — Winston Hsu (57) ABSTRACT

A slide rail assembly includes a first rail, a second rail and at least one supporting member. The first rail has a first end and a second end opposite to the first end. The second rail is movable relative to the first rail. The second rail has a recessed part. The at least one supporting member is movably mounted between the first rail and the second rail. A portion of the at least one supporting member is accommodated in the recessed part. The at least one supporting member is configured to support the second rail. Wherein, when the at least one supporting member is moved from a first position to a second position, the portion of the at least one supporting member is extended beyond the first end of the first rail.

20 Claims, 7 Drawing Sheets

(51) Int. Cl.
 *H05K 7/18* (2006.01)
 *H05K 7/14* (2006.01)
 *A47B 88/493* (2017.01)
 *A47B 88/427* (2017.01)
 *A47B 88/423* (2017.01)

(56) References Cited

U.S. PATENT DOCUMENTS

| | | |
|---|---|---|
| 6,305,556 B1 | 10/2001 | Mayer |
| 6,424,534 B1 | 7/2002 | Mayer |
| 6,601,713 B2 | 8/2003 | Kaminski |
| 6,655,534 B2 | 12/2003 | Williams |
| 7,350,884 B2 | 4/2008 | Palker |
| 8,240,789 B2 * | 8/2012 | Chen .................... F16C 29/046 312/333 |
| 8,240,790 B2 | 8/2012 | Zhang |
| 8,287,059 B2 | 10/2012 | Yang |
| 8,469,467 B2 | 6/2013 | Chang |
| 9,565,938 B2 * | 2/2017 | Barnes .................... A47B 88/44 |
| 9,635,942 B2 | 5/2017 | Chen |
| 9,681,748 B2 * | 6/2017 | Chen .................... A47B 88/453 |
| 9,681,749 B2 * | 6/2017 | Chen .................... A47B 88/49 |
| 2002/0081887 A1 | 6/2002 | Judge |
| 2007/0296318 A1 * | 12/2007 | Peng .................... A47B 88/493 312/334.44 |
| 2013/0259411 A1 | 10/2013 | Judge |
| 2016/0262540 A1 | 9/2016 | Chen |

FOREIGN PATENT DOCUMENTS

| | | |
|---|---|---|
| JP | 3163549 U | 10/2010 |
| JP | 3198564 U | 7/2015 |
| JP | 3200607 U | 10/2015 |

* cited by examiner

SLIDE RAIL ASSEMBLY

BACKGROUND OF THE INVENTION

1. Field of the Invention

The present invention relates to a slide rail assembly, and more particularly, to a slide rail assembly having at least one supporting member for supporting a slide rail.

2. Description of the Prior Art

Generally, in a rack system, a slide rail system is configured to mount a carried object (such as a chassis of an electronic device) to a rack. As data usage is dramatically increased, there are more electronic devices mounted in the chassis, such that the slide rail assembly needs to support a heavier chassis, in order to allow the chassis to be safely pulled out of the rack for maintenance. As such, it is important to design a slide rail assembly with improved supporting ability in slide rail related industries.

Related patents for rack server system of the prior art, such as U.S. Pat. No. 6,181,549 B1, U.S. Pat. No. 6,230,903 B1, U.S. Pat. No. 6,305,556 B1, U.S. Pat. No. 6,424,534 B1, U.S. Pat. No. 6,601,713 B2, U.S. Pat. No. 6,655,534 B2, U.S. Pat. No. 7,350,884 B2, and U.S. Pat. No. 8,287,059 B2 are provided for reference.

SUMMARY OF THE INVENTION

The present invention relates to a slide rail assembly comprising two rails with at least one adjustable supporting member arranged between the two rails.

According to an embodiment of the present invention, a slide rail assembly comprises a first rail, a second rail and at least one supporting member. The first rail has a first end and a second end opposite to the first end. The second rail is movable relative to the first rail. The second rail has a recessed part. The at least one supporting member is movably mounted between the first rail and the second rail. A portion of the at least one supporting member is accommodated in the recessed part. The at least one supporting member is configured to support the second rail. Wherein, when the at least one supporting member is moved from a first position to a second position, the portion of the at least one supporting member is extended beyond the first end of the first rail.

Preferably, the first rail comprises an upper wall, a lower wall and a side wall connected between the upper wall and the lower wall. A passage is defined by the upper wall, the lower wall and the side wall for accommodating the second rail. One of the upper wall and the lower wall of the first rail provides a space to allow the at least one supporting member to move therein.

Preferably, the first rail has a first limiting part and a second limiting part, and the space is located between the first limiting part and the second limiting part.

Preferably, the at least one supporting member comprises a supporting part and an extension part connected to the supporting part. A portion of the supporting part is accommodated in the recessed part, and the extension part is located in the space.

Preferably, the second rail comprises an upper wall and a lower wall corresponding to the upper wall and the lower wall of the first rail respectively.

Preferably, the slide rail assembly further comprises a bracket connected to the first rail to be adjacent to the first end of the first rail, and the bracket is configured to mount the slide rail to a post.

Preferably, the slide rail assembly further comprises at least one sliding auxiliary device mounted between the first rail and the second rail. The at least one sliding auxiliary device comprises at least one rolling member configured to assist the second rail in moving relative to the first rail.

Preferably, the second rail has a first driving part and a second driving part. The second rail is configured to push the at least one sliding auxiliary device along a first direction through the first driving part to drive the at least one supporting member to move from the first position to the second position; and the second rail is configured to drive the at least one supporting member through the second driving part along a second direction to move the at least one supporting member from the second position to the first position along a second direction.

Preferably, the at least one sliding auxiliary device and the at least one supporting member are located between the first driving part and the second driving part.

Preferably, the second rail has a first driving part and a second driving part, the second rail is configured to drive the at least one supporting member through the first driving part along a first direction to move the at least one supporting member from the first position to the second position; and the second rail is configured to drive the at least one supporting member through the second driving part along a second direction to move the at least one supporting member from the second position to the first position.

Preferably, the slide rail assembly further comprises a third rail movable relative to the second rail.

According to another embodiment of the present invention, a slide rail assembly comprises a first rail, a bracket, a second rail and at least one supporting member. The bracket is connected to the first rail. The second rail is movable relative to the first rail. The second rail has a recessed part. The at least one supporting member is movably mounted between the first rail and the second rail. A portion of the at least one supporting member is accommodated in the recessed part. Wherein, when the at least one supporting member is moved from a first position to a second position, the portion of the at least one supporting member is extended beyond one of the first rail and the bracket.

According to another embodiment of the present invention, a slide rail assembly comprises a first rail, a bracket, a second rail and at least one supporting member. The bracket is connected to the first rail and configured to be mounted to the rack. The second rail is movable relative to the first rail. The second rail has a recessed part. The at least one supporting member is movably mounted between the first rail and the second rail. A portion of the at least one supporting member is accommodated in the recessed part. Wherein, when the at least one supporting member is moved from a first position to a second position, the portion of the at least one supporting member is located outside the rack and extended beyond one of the first rail and the bracket for supporting the second rail.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
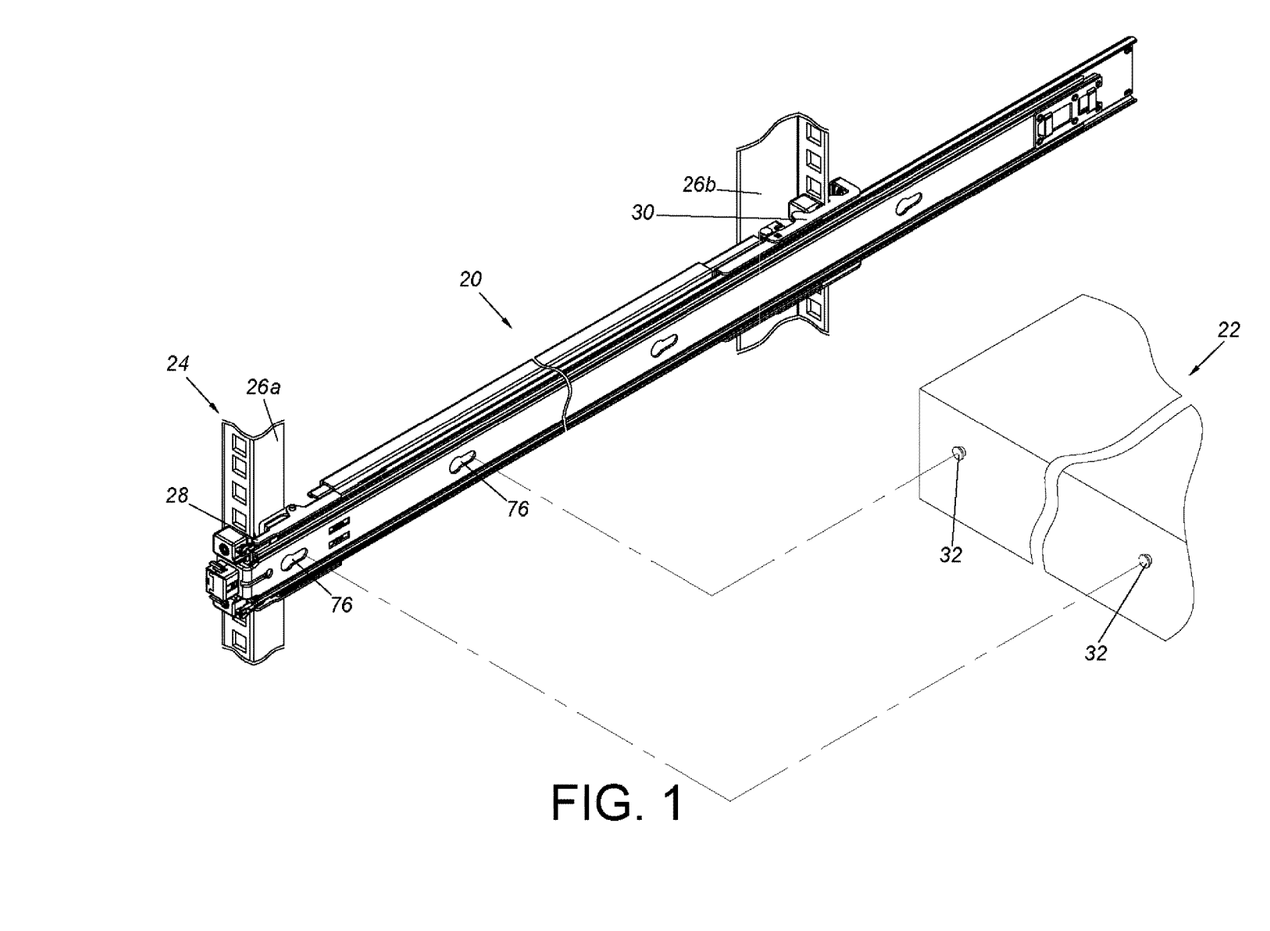
FIG. 1 is a diagram showing a slide rail assembly configured to mount a carried object to a rack according to an embodiment of the present invention.

FIG. 1 is a diagram showing a slide rail assembly 20 configured to mount a carried object 22 to a rack 24 according to an embodiment of the present invention. The rack 24 comprises a first post 26a and a second post 26b. The slide rail assembly 20 can be correspondingly mounted to the first post 26a and the second post 26b through a first bracket 28 and a second bracket 30. On the other hand, the carried object 22 can be a chassis or a drawer for electronic equipment. The carried object 22 has a plurality of mounting members 32 capable of being mounted to a rail of the slide rail assembly 20.

Figure 2:
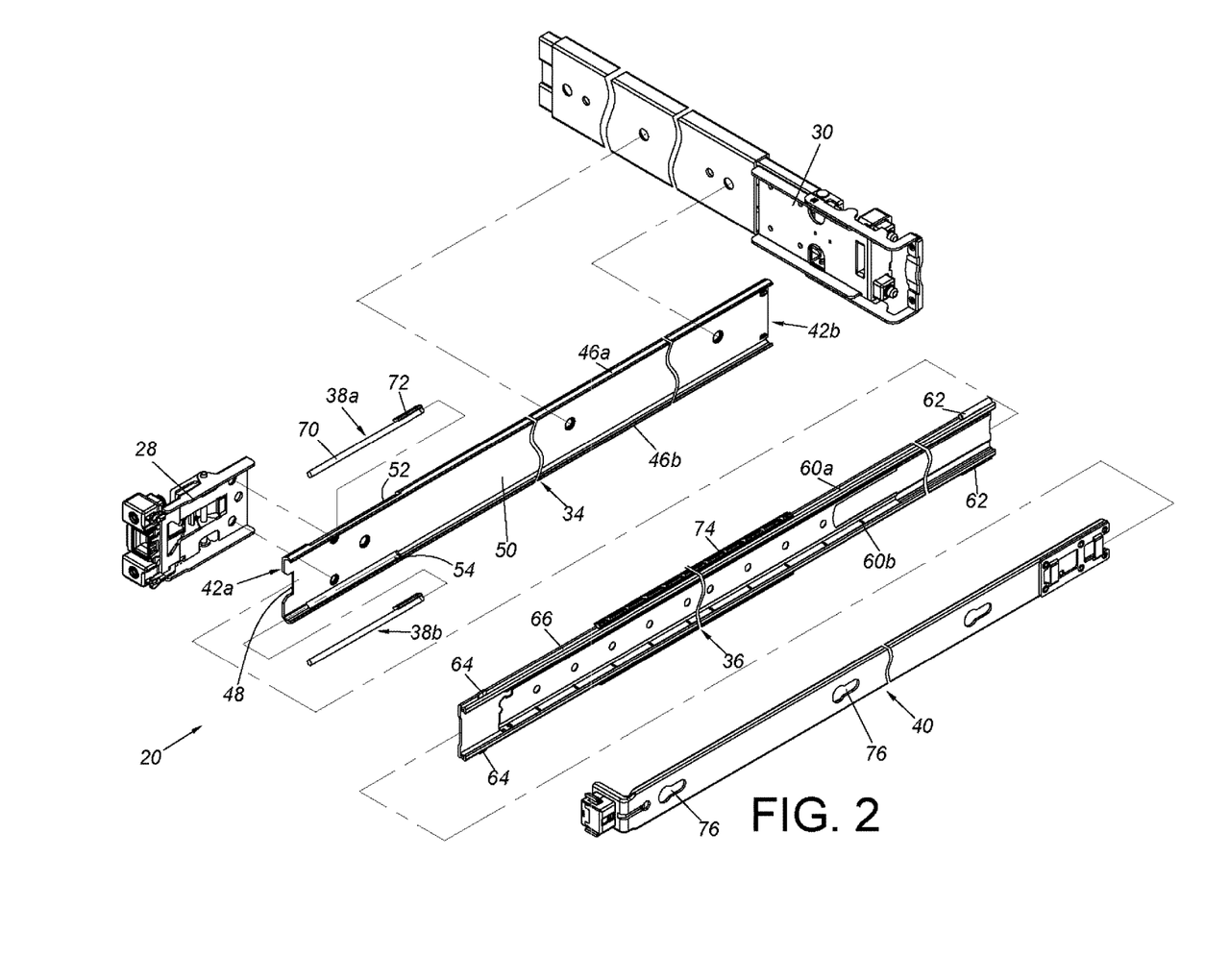
FIG. 2 is an exploded view of the slide rail assembly according to an embodiment of the present invention.

As shown in FIG. 2, the slide rail assembly 20 comprises a first rail 34, a second rail 36 and at least one supporting member. In the present embodiment, the at least one supporting member comprises a first supporting member 38a and a second supporting member 38b, and the first supporting member 38a and the second supporting member 38b have substantially identical structures. Preferably, the slide rail assembly 20 further comprises a third rail 40.

The first rail 34 has a first end 42a and a second end 42b opposite to the first end 42a. The first bracket 28 is connected to the first rail 34 to be adjacent to the first end 42a of the first rail 34. The second bracket 30 is connected to the first rail 34 to be adjacent to the second end 42b of the first rail 34.

Figure 3:
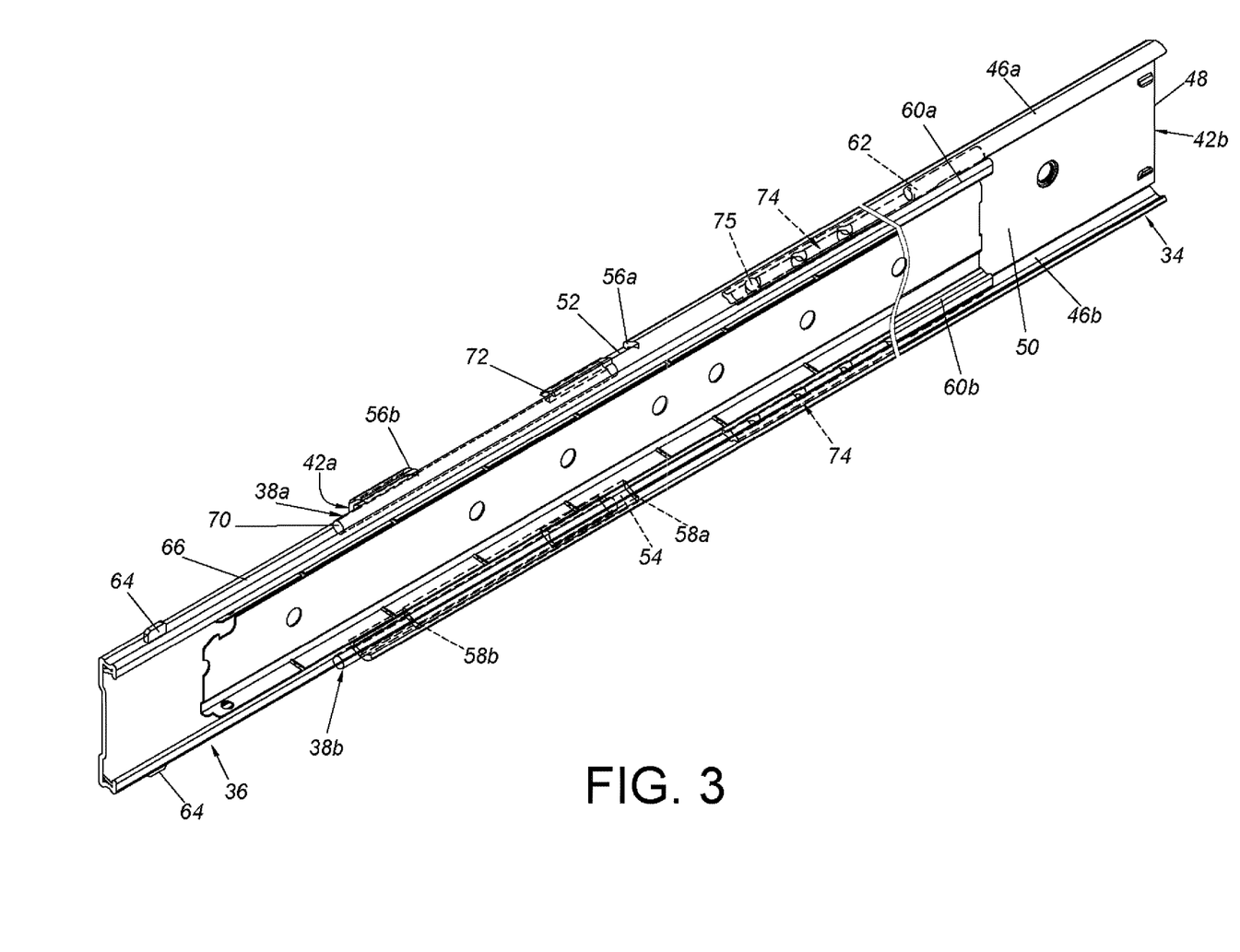
FIG. 3 is a diagram showing a combination of a first rail and a second rail of the slide rail assembly according to an embodiment of the present invention.

As shown in FIG. 3, the first rail 34 comprises an upper wall 46a, a lower wall 46b and a side wall 48 connected between the upper wall 46a and the lower wall 46b. A passage 50 is defined by the upper wall 46a, the lower wall 46b and the side wall 48 of the first rail 34. Each of the upper wall 46a and the lower wall 46b of the first rail 34 is arranged with a bounded space. For example, an elongated hole is formed on each of the upper wall 46a and the lower wall 46b of the first rail 34. In the present embodiment, a first space 52 is provided by the elongated hole on the upper wall 46a of the first rail 34, and a second space 54 is provided by the elongated hole on the lower wall 46b of the first rail 34. The first space 52 and the second space 54 are configured to allow the first supporting member 38a and the second supporting member 38b to move within a limited range.

Preferably, the upper wall 46a of the first rail 34 has a first limiting part 56a and a second limiting part 56b. The first space 52 is defined by the first limiting part 56a and the second limiting part 56b. On the other hand, the lower wall 46b of the first rail 34 has a first limiting part 58a and a second limiting part 58b. The second space 54 is defined by the first limiting part 58a and the second limiting part 58b.

The second rail 36 is accommodated in the passage 50 of the first rail 34. In particular, the second rail 36 comprises an upper wall 60a and a lower wall 60b corresponding to the upper wall 46a and the lower wall 46b of the first rail 34 respectively. Preferably, the second rail 36 has at least one first driving parts 62 and at least one second driving parts 64 arranged on the upper wall 60a and/or the lower wall 60b of the second rail 36. Wherein, the first driving part 62 and the second driving part 64 are protrusions. In the present embodiment, the first driving parts 62 are arranged on the upper wall 60a and the lower wall 60b of the second rail 36 and adjacent to a first end of the second rail 36; the second driving parts 64 are arranged on the upper wall 60a and the lower wall 60b of the second rail 36 and adjacent to a second end of the second rail 36. Preferably, the upper wall 60a and/or the lower wall 60b of the second rail 36 has a curved recessed part. In the present embodiment, each of the upper wall 60a and the lower wall 60b of the second rail 36 has a recessed part 66, such as a groove.

The first supporting member 38a and the second supporting member 38b are movably mounted between the first rail 34 and the second rail 36 and configured to support the second rail 36. The first supporting member 38a and the second supporting member 38b are arranged along longitudinal directions of the first rail 34 and the second rail 36. Take the first supporting member 38a as an example, the first supporting member 38a has a supporting part 70 and an extension part 72 connected to the supporting part 70. In the present embodiment, a length of the supporting part 70 is greater than a length of the extension part 72. In addition, an outline of the supporting part 70 substantially corresponds to the recessed part 66, such that a portion of the supporting part 70 is accommodated in the recessed part 66. The extension part 72 is located in the first space 52. On the other hand, since arrangement of the second supporting member 38b is identical to arrangement of the first supporting member 38a, no further illustration is provided.

Preferably, the slide rail assembly 20 further comprises at least one sliding auxiliary device 74 movably mounted between the first rail 34 and the second rail 36. The at least one sliding auxiliary device 74 comprises at least one rolling member 75, such as a ball or a roller, configured to assist the second rail 36 in moving relative to the first rail 34. In addition, the at least one sliding auxiliary device 74 and the at least one supporting member (the first supporting member 38a and/or the second supporting member 38b) are located between the first driving part 62 and the second driving part 64 of the second rail 36.

The third rail 40 is movable relative to the second rail 36, and has a plurality of mounting holes 76 configured to mount the mounting member 32 of the carried object 22. Since arrangement of the mounting hole is well known to those skilled in the art, no further illustration is provided.

Figure 4:
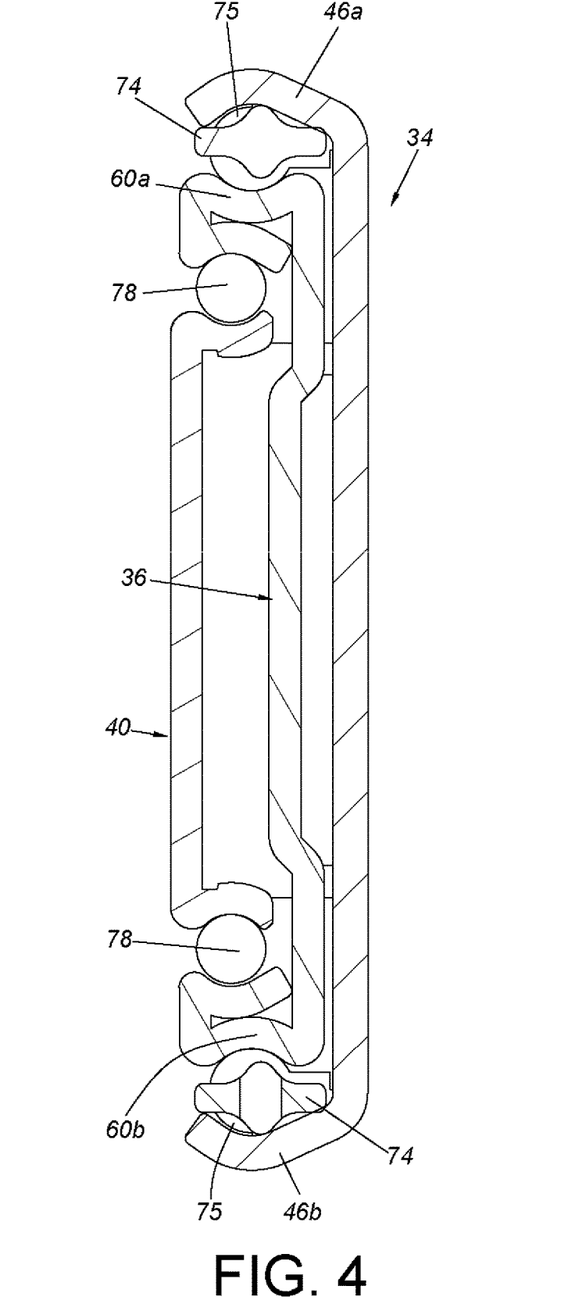
FIG. 4 is a cross-sectional view of the slide rail assembly according to an embodiment of the present invention.

As shown in FIG. 4, the rolling members 75 of the sliding auxiliary device 74 can be arranged between the upper wall 46a of the first rail 34 and the upper wall 60a of the second rail 36, and between the lower wall 46b of the first rail 34 and the lower wall 60b of the second rail 36, in order to assist the second rail 36 in moving relative to the first rail 34. On the other hand, rolling members 78, such as balls or rollers, can be arranged between the second rail 36 and the third rail 40 to assist the second rail 36 and the third rail 40 in moving relative to each other.

Figure 5:
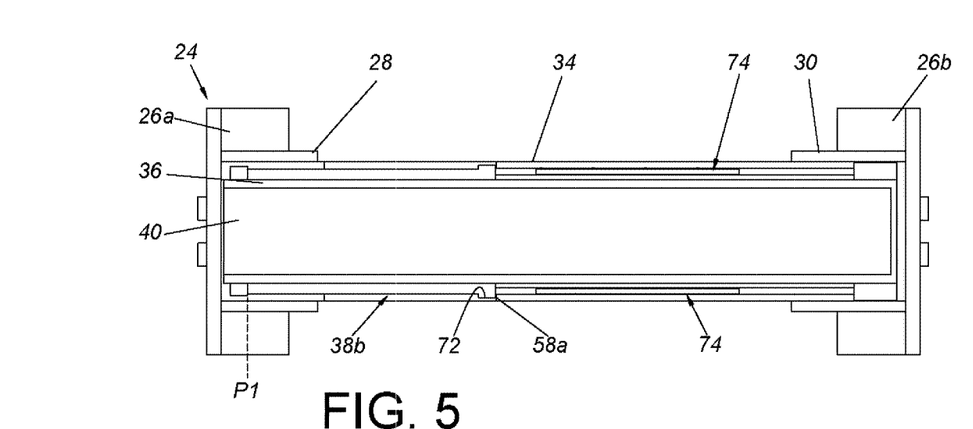
FIG. 5 is a diagram showing the first rail of the slide rail assembly being mounted to a pair of posts of the rack according to an embodiment of the present invention, wherein the second rail and a third rail of the slide rail assembly are in a retracted state relative to the first rail.

AS shown in FIG. 5, the first rail 34 is correspondingly mounted to the first post 26a and the second post 26b of the rack 24 through the first bracket 28 and the second bracket 30. The second rail 36 and the third rail 40 are in a retracted state relative to the first rail 34. In addition, the at least one supporting member (such as the second supporting member 38b) is located at a first position P1. Wherein, when the second supporting member 38b is located at the first position P1, the second supporting member 38b is inside the rack 24 and adjacent to the first post 26a. The extension part 72 of the second supporting member 38b is adjacent to the first limiting part 58a.

Figure 6:
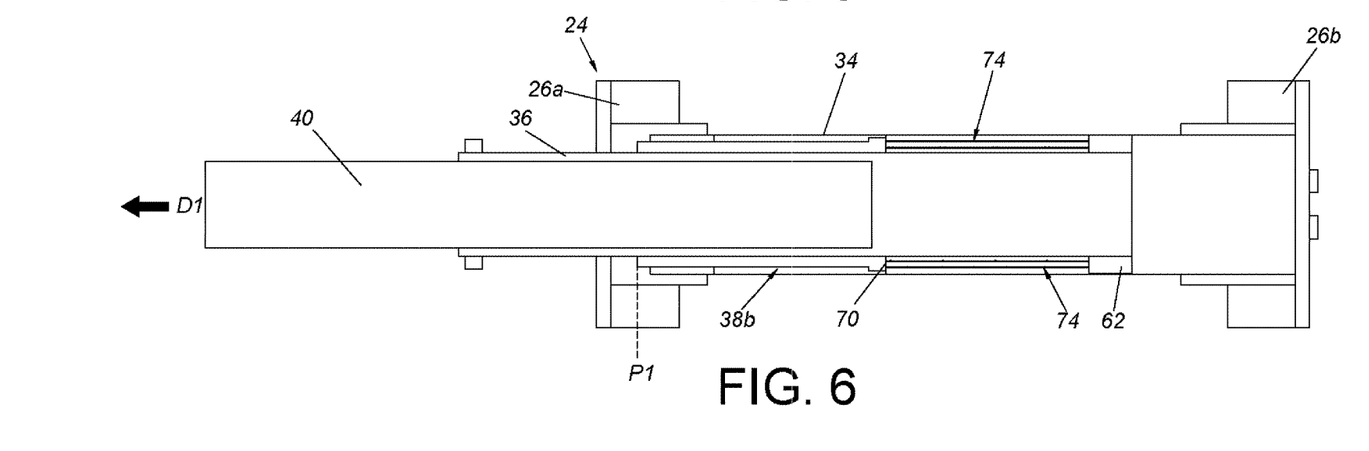
FIG. 6 is a diagram showing the second rail and the third rail of the slide rail assembly of FIG. 5 being moved relative to the first rail along a first direction, wherein at least one supporting member is located at a first position.

As shown in FIG. 6, when the third rail 40 is moved along a first direction D1 relative to the second rail 36 (during a process of the second rail 36 and the third rail 40 being moved along the first direction D1 relative to the first rail 34), the at least one sliding auxiliary device 74 is moved along the first direction D1 relative to the first rail 34 in response to the movement of the second rail 36. When the second rail 36 is moved a predetermined distance along the first direction D1 relative to the first rail 34, the second rail 36 drives the at least one sliding auxiliary device 74 through the first driving part 62 of the second rail 36, such that the at least one sliding auxiliary device 74 contacts a portion of the second supporting member 38b (such as the supporting part 70). Or, the at least one sliding auxiliary device 74 can be moved to contact the second supporting member 38b by a force generated during an operation of pulling out the rails, so as to further drive the second supporting member 38b to move.

Figure 7:
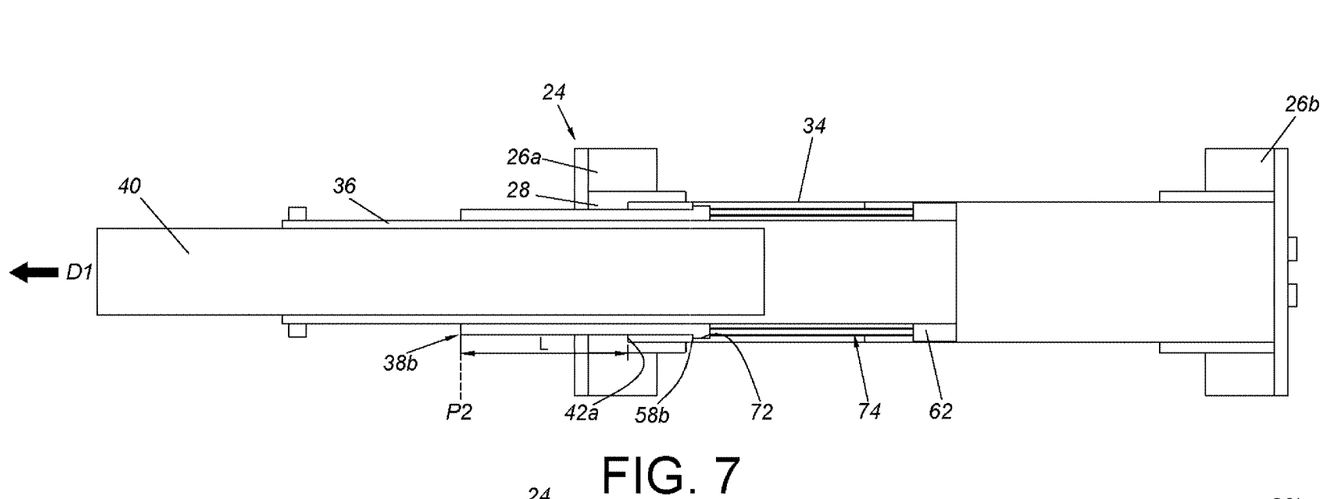
FIG. 7 is a diagram showing the second rail and the third rail of the slide rail assembly of FIG. 6 being further moved along the first direction, wherein the at least one supporting member is moved to a second position.

As shown in FIG. 7, when the second rail 36 (and the third rail 40) is further moved along the first direction D1 relative to the first rail 34, the second rail 36 is capable of driving the at least one support member, such as driving the second supporting member 38b to move from the first position P1 to the second position P2 relative to the first rail 34 or the first bracket 28. In the present embodiment, the second rail 36 is capable of driving the sliding auxiliary device 74 to move along the first direction D1 through the first driving part 62 after the second rail 36 being moved the predetermined distance, and the sliding auxiliary device 74 further drives the second supporting member 38b to move from the first position P1 to the second position P2 along the first direction D1. Wherein, when the second supporting member 38b is located on the second position P2, a portion of the second supporting member 38b is extended a distance L beyond the first end 42a of the first rail 34 or the first bracket 28, in order to support the second rail 36. In particular, when the second supporting member 38b is located at the second position P2, the portion of the second supporting member 38b is located outside the rack 24 and adjacent to the first post 26a, such that the second supporting member 38b provides support to the second rail 36 outside the rack 24 for enhancing support effect of expansion. In addition, when the second supporting member 38b is located at the second position P2, the extension part 72 of the second supporting member 38b abuts against the second limiting part 58b.

In the present embodiment, the second rail 36 is configured to push the sliding auxiliary device 74 for driving the second supporting member 38b to move from the first position P1 to the second position P2. However, the present invention is not limited thereto. When the second rail 36 is moved along the first direction D1, the second rail 36 can also drive (or push) the at least one supporting member (such as the second supporting member 38b) directly through the first driving part 62 to move from the first position P1 to the second position P2. Or, the at least one supporting member (such as the second supporting member 38b) can be moved from the first position P1 to the second position P2 by manual operation or by a sliding force between the rails.

Figure 8:
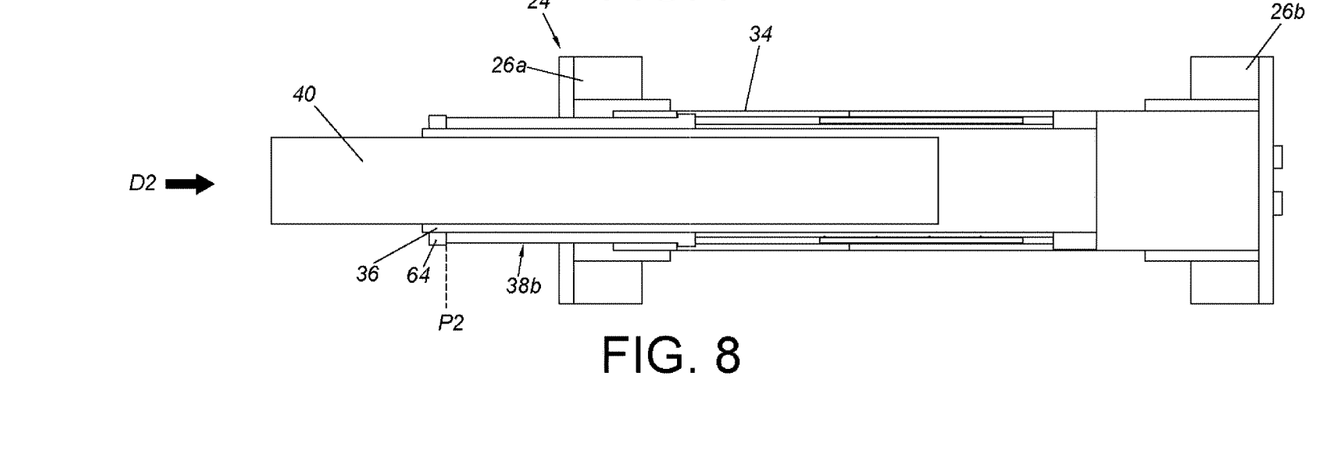
FIG. 8 is a diagram showing the second rail and the third rail of the slide rail assembly of FIG. 7 being moved relative to the first rail along a second direction from an extended state.
Figure 9:
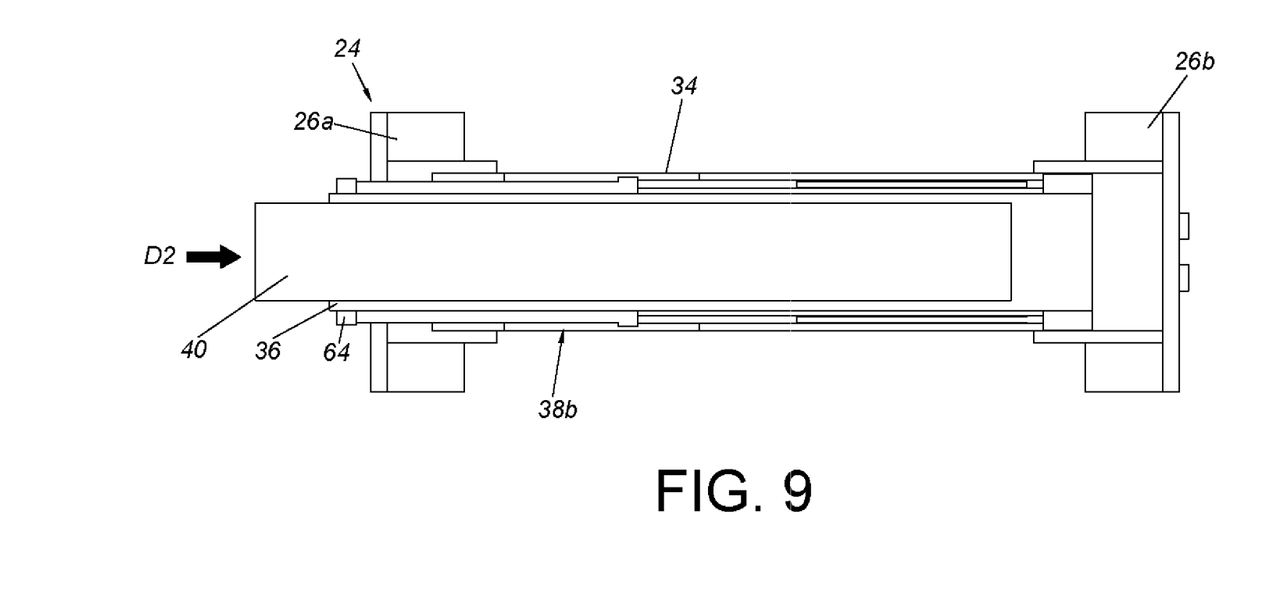
FIG. 9 is a diagram showing the second rail and the third rail of the slide rail assembly of FIG. 8 being further moved relative to the first rail along the second direction, wherein the at least one supporting member is moved along the second direction from the second position toward the first position.

As shown in FIG. 8 and FIG. 9, the second rail 36 (and the third rail 40) is in an extended state relative to the first rail 34. When the second rail 36 (and the third rail 40) is moved along a second direction D2 (the direction opposite to the first direction D1) relative to the first rail 34, the second rail 36 can drive the at least one supporting member, such as the second supporting member 38b, through the second driving part 64 to move from the second position P2 toward the first position P1 along the second direction D2, such that the second supporting member 38b is moved into the rack 24 again to be adjacent to the first post 26a (please refer to FIG. 5 again).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A slide rail assembly, comprising:
a first rail having a first end and a second end opposite to the first end, the first rail comprising an upper wall, a lower wall and a side wall connected between the upper wall and the lower wall, a passage being defined by the upper wall, the lower wall and the side wall of the first rail;
a second rail accommodated in the passage of the first rail and movable relative to the first rail, the second rail comprising an upper wall corresponding to the upper wall of the first rail, the second rail having a recessed part; and
at least one supporting member movably mounted between the upper wall of the first rail and the upper wall of the second rail and disposed near the first end, a portion of the at least one supporting member being accommodated in the recessed part, and the at least one supporting member configured to be driven by and support the second rail;
wherein when the second rail is moved relative to the first rail for a predetermined distance along a first direction to extend beyond the first end, the at least one supporting member is moved in conjunction with the second rail from a first position to a second position, and the portion of the at least one supporting member extends beyond the first end of the first rail for supporting the second rail, wherein the first direction is a direction away from the first rail.

2. The slide rail assembly of claim 1, wherein one of the upper wall and the lower wall of the first rail provides a space to allow the at least one supporting member to move therein.

3. The slide rail assembly of claim 2, wherein the first rail has a first limiting part and a second limiting part, the space is located between the first limiting part and the second limiting part.

4. The slide rail assembly of claim 2, wherein the at least one supporting member comprises a supporting part and an extension part connected to the supporting part, a portion of the supporting part is accommodated in the recessed part, the extension part is located in the space.

5. The slide rail assembly of claim 2, wherein the second rail further comprises a lower wall corresponding to the upper wall and the lower wall of the first rail respectively.

6. The slide rail assembly of claim 1, further comprising a bracket connected to the first rail to be adjacent to the first end of the first rail, the bracket configured to mount the slide rail to a post.

7. The slide rail assembly of claim 1, further comprising at least one sliding auxiliary device mounted between the first rail and the second rail, the at least one sliding auxiliary device comprising at least one rolling member configured to assist the second rail in moving relative to the first rail.

8. The slide rail assembly of claim 7, wherein the second rail has a first driving part and a second driving part, the second rail is configured to push the at least one sliding auxiliary device along a first direction through the first driving part to drive the at least one supporting member to move from the first position to the second position, the second rail is configured to drive the at least one supporting member through the second driving part along a second direction to move the at least one supporting member from the second position to the first position along a second direction.

9. The slide rail assembly of claim 8, wherein the at least one sliding auxiliary device and the at least one supporting member are located between the first driving part and the second driving part.

10. The slide rail assembly of claim 1, wherein the second rail has a first driving part and a second driving part, the second rail is configured to drive the at least one supporting member through the first driving part along a first direction to move the at least one supporting member from the first position to the second position, the second rail is configured to drive the at least one supporting member through the second driving part along a second direction to move the at least one supporting member from the second position to the first position.

11. The slide rail assembly of claim 1, further comprising a third rail movable relative to the second rail.

12. A slide rail assembly, comprising:
a first rail having a first end and a second end opposite to the first end;
a bracket connected to the first rail;
a second rail movable relative to the first rail, the second rail having a recessed part; and
at least one supporting member movably mounted between the first rail and the second rail and disposed near the first end, a portion of the at least one supporting member being accommodated in the recessed part, and the at least one supporting member being configured to be driven by and support the second rail;
wherein when the second rail is moved relative to the first rail for a predetermined distance along a first direction to extend beyond the first end, the at least one supporting member is moved in conjunction with the second rail from a first position to a second position, and the portion of the at least one supporting member extends beyond one of the first rail and the bracket for supporting the second rail, wherein the first direction is a direction away from the first rail.

13. The slide rail assembly of claim 12, wherein the first rail has a first end and a second end opposite to the first end, the bracket is connected to the first rail to be adjacent to the first end of the first rail.

14. The slide rail assembly of claim 12, wherein one of the upper wall and the lower wall of the first rail provides a space to allow the at least one supporting member to move therein.

15. The slide rail assembly of claim 14, wherein the first rail has a first limiting part and a second limiting part, the space is located between the first limiting part and the second limiting part.

16. The slide rail assembly of claim 14, wherein the at least one supporting member comprises a supporting part and an extension part connected to the supporting part, a portion of the supporting part is accommodated in the recessed part, the extension part is located in the space.

17. The slide rail assembly of claim 12, further comprising at least one sliding auxiliary device mounted between the first rail and the second rail, the at least one sliding auxiliary device comprising at least one rolling member configured to assist the second rail in moving relative to the first rail, wherein the second rail has a first driving part and a second driving part, the second rail is configured to push the at least one sliding auxiliary along a first direction through the first driving part to drive the at least one supporting member to move from the first position to the second position, the second rail is configured to drive the at least one supporting member through the second driving part along a second direction to move the at least one supporting member from the second position to the first position.

18. A slide rail assembly, configured to be mounted to a rack, comprising:
a first rail having a first end and a second end opposite to the first end, the first rail, the first rail comprising an upper wall, a lower wall and a side wall connected between the upper wall and the lower wall, a passage being defined by the upper wall, the lower wall and the side wall of the first rail;
a bracket connected to the first rail, and configured to be mounted to the rack;
a second rail accommodated in the passage of the first rail and movable relative to the first rail, the second rail comprising an upper wall corresponding to the upper wall of the first rail, the second rail having a recessed part, a side whereon the recessed part is formed facing the upper wall of the first rail; and
at least one supporting member movably mounted between the upper wall of the first rail and the upper wall of the second rail and disposed near the first end, a portion of the at least one supporting member being accommodated in the recessed part, and the at least one supporting member being configured to be driven by and support the second rail;
wherein when the second rail is moved relative to the first rail for a predetermined distance along a first direction to extend beyond the first end, the at least one supporting member is moved in conjunction with the second rail from a first position to a second position, and the portion of the at least one supporting member is located outside the rack and extends beyond one of the first rail and the bracket for supporting the second rail for supporting the second rail, wherein the first direction is a direction away from the first rail.

19. The slide rail assembly of claim 18, wherein the rack comprises a first post and a second post, the bracket is configured to be mounted to one of the first post and the second post.

20. The slide rail assembly of claim 18, wherein one of the upper wall and the lower wall of the first rail has a first limiting part and a second limiting part, a space is defined between the first limiting part and the second limiting part, the at least one supporting member has a supporting part and an extension part connected to the supporting part, a portion of the supporting part is accommodated in the recessed part, the extension part is located in the space.

* * * * *